United States Patent [19]

Ingham et al.

[11] Patent Number: 5,278,030
[45] Date of Patent: Jan. 11, 1994

[54] DEVELOPER SOLUTION COMPRISING ETHYL HEXYL SULPHATE, A SURFACTANT, AN ALKALINE MATERIAL AND HAVING A PH OF NOT LESS THAN 12

[75] Inventors: Michael Ingham, Yorkshire; Paul A. Styan, Leeds, both of United Kingdom

[73] Assignee: Du Pont-Howson Limited, Seacroft, United Kingdom

[21] Appl. No.: 609,876

[22] Filed: Nov. 6, 1990

Related U.S. Application Data

[63] Continuation-in-part of Ser. No. 424,065, Oct. 19, 1989, abandoned.

[30] Foreign Application Priority Data

Oct. 24, 1988 [GB] United Kingdom ............... 8824841
Mar. 10, 1989 [GB] United Kingdom ............... 8905577
Jul. 21, 1989 [GB] United Kingdom ............... 8916717

[51] Int. Cl.$^5$ ............... G03F 7/32; G03F 7/016; G03F 7/023; C11D 1/18
[52] U.S. Cl. ............... 430/331; 430/157; 430/165; 430/176; 430/192; 430/278; 430/302; 252/86; 252/156; 252/174.21
[58] Field of Search ............... 430/331, 325, 326, 192, 430/157, 165, 176, 278, 302; 252/86, 156, 173, 174.21, 174.22

[56] References Cited

U.S. PATENT DOCUMENTS

| | | | |
|---|---|---|---|
| 3,615,480 | 10/1971 | Lam | 430/331 |
| 3,719,491 | 3/1973 | Mizianty | 430/187 |
| 3,864,476 | 2/1975 | Altieri | 424/71 |
| 3,926,827 | 12/1975 | Mangeli | 252/540 |
| 4,094,701 | 6/1978 | Fekete | 252/84 |
| 4,147,545 | 4/1979 | Rowe et al. | 430/331 |
| 4,186,006 | 1/1980 | Kobayashi et al. | 430/331 |
| 4,267,249 | 5/1981 | Baumann | 430/186 |
| 4,350,756 | 9/1982 | Barch et al. | 430/331 |
| 4,355,096 | 10/1982 | Walls | 430/330 |
| 4,395,480 | 7/1983 | Sprintschnik | 430/331 |
| 4,467,027 | 8/1984 | Yamamoto et al. | 430/192 |
| 4,576,903 | 3/1986 | Baron et al. | 430/331 |
| 4,711,836 | 12/1987 | Ferreira | 430/331 |
| 4,780,396 | 10/1988 | Hsieh et al. | 430/331 |
| 4,851,324 | 7/1989 | Hsieh | 430/331 |

FOREIGN PATENT DOCUMENTS

| | | |
|---|---|---|
| 0099003 | 1/1984 | European Pat. Off. |
| 0180122 | 5/1986 | European Pat. Off. |
| 0279164 | 8/1988 | European Pat. Off. |
| 2110401 | 6/1983 | United Kingdom |

*Primary Examiner*—Lee C. Wright
*Assistant Examiner*—John S. Chu
*Attorney, Agent, or Firm*—Harness, Dickey & Pierce

[57] ABSTRACT

A developer liquid for image-wise exposed radiation sensitive compositions comprises ethyl hexyl sulphate, a surfactant, and alkaline material such that the pH is al least 12 and preferably at least 13.5. The developer liquid may additionally include a water soluble carboxylic acid salt such as sodium octanoate and the sodium salt of ethylene diamine tetra acetic acid. Such developer liquids can be formulated for use with both positive-working and negative-working compositions.

7 Claims, No Drawings

DEVELOPER SOLUTION COMPRISING ETHYL HEXYL SULPHATE, A SURFACTANT, AN ALKALINE MATERIAL AND HAVING A PH OF NOT LESS THAN 12

This is a continuation-in-part application of U.S. Patent Application No. 07/424,065 filed on the Oct. 19, 1989, now abandoned.

This invention relates to the development of radiation-sensitive compositions and is concerned with the development of such compositions as are used for the production of printing plates and photoresists.

In the production of printing plates and photoresists, a radiation sensitive composition is coated onto a substrate to form a radiation sensitive plate which is then image-wise exposed to radiation so as to selectively expose different areas of the coating. The radiation struck areas and non-radiation struck areas have differing solubility in developer liquids and thus the more soluble areas can be selectively removed from the substrate by the application of a suitable developer liquid to leave an image on the substrate constituted by the less soluble areas.

Radiation sensitive compositions are usually classified as being either positive-working or negative-working. Positive-working compositions have the property of becoming more soluble in a given developer liquid when exposed to radiation whereas negative-working compositions have the property of becoming less soluble.

This difference has meant that in the past, the developer liquids used for the two classes of composition have been substantially different. In particular, negative-working compositions have generally required a developer liquid comprising a substantial proportion of an organic solvent. Thus a developer liquid suitable for positive-working compositions would not satisfactorily develop a negative-working composition and a developer liquid suitable for a negative-working composition would over develop a positive-working composition.

Attempts have been made to produce a developer liquid which will develop both positive- and negative-working compositions by admixing together a developer liquid intended for a positive-working composition and a developer liquid intended for a negative-working composition. Such proposals have not been successful.

In U.S. Patent Specification No. 4851324 there is described a developer liquid comprising (a) from about 0.1% to about 20% by weight of sodium octyl sulphate and/or sodium tetradecyl sulphate and/or sodium 2-ethyl hexyl sulphate and/or ammonium lauryl sulphate; and (b) from about 0.1% to about 30% by weight of one or more lithium salts of hydroxy, aryl and alkylcarboxylic acids; and (c) from about 0.1% to about 30% by weight of one or more potassium salts of hydroxy, aryl and alkyl carboxylic acids; and (d) from about 0.5% to about 30% by weight of phenoxy propanol.

The pH of the developer liquid must be in the range of from about 6.5 to about 7.5 and the developer liquid may additionally include a base component such as an alkali metal hydroxide provided that the pH of the developer liquid is in this range. The developer liquid is designed for removing the non-image areas of exposed, usually negative-working, compositions containing diazonium salts. Attempts to develop positive-working plates have proved to be unsatisfactory.

U.S. Patent specification No. 4780396 describes an identical developer liquid except that the phenoxy propanol solvent is omitted. Again, the pH of the developer liquid must be from about 6.5 to about 7.5. There is a suggestion that the developer liquid is suitable for removing the non-image areas of exposed negative working or positive working compositions. However the only compositions exemplified are negative working compositions based on polymeric diazonium salts or photopolymers. Attempts to use the developer liquid for positive working compositions have proved to be unsatisfactory.

It is an object of the present invention to provide a developer liquid suitable for use in developing both positive and negative-working compositions.

According to one aspect of the present invention there is provided a developer liquid comprising an ethyl hexyl sulphate, an anionic or non-ionic surface active agent, and alkaline material such that the pH of the developer liquid is not less than 12.

The developer liquid is essentially aqueous and can be used either to develop exposed positive-working compositions such as compositions comprising a quinone diazide and an alkali soluble resin, compositions comprising a quinone diazide and a novolak resin, or compositions comprising a quinone diazide novolak ester or to develop exposed negative-working compositions such as compositions comprising a diazo compound containing groups having the structure

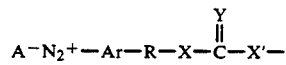

in which Ar represents a divalent or other polyvalent radical derived from an aromatic or heteroaromatic compound; X and X' which may be the same or different, each represents O, S or an imino group, provided that at least one of X and X' is an imino group; Y represents O or S; R represents a single bond or a divalent or other polyvalent radical; and A⁻ is an anion (as described in EP-A-0030862 which is herein incorporated by reference), compositions comprising at least one photoinitiator and at least one photopolymerisable compound which is an acrylic or methacrylic ester of a tetra functional polyol having the general formula:

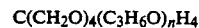

wherein the average degree of propoxylation n is from 3 to 6, from 50% to 90% of the available hydroxy groups have been converted to acrylate or methacrylate groups, and the remaining hydroxy groups have been reacted with a di-isocyanate or a polyisocyanate (as described in EP-A-0260823 which is herein incorporated by reference), compositions comprising a thioxanthone sensitiser and a light sensitive polymer having pendant dimethyl maleimide groups, compositions comprising supported diazodiphenylamine/formaldehyde condensate, or compositions comprising trimethylolethane triacrylate and a methyl methacrylate/methacrylic acid copolymer as binder.

The developer liquid is particularly suitable for use in machines for automatically developing radiation sensitive plates including such compositions. Generally, the developer liquid can be used in any processor designed for developing positive-working plates. The useful life of the developer liquid will depend on the manner in which the development section of the processor is constructed. Processors having fully enclosed development tanks will give greater bath life due to restricted contact of the developer liquid with the atmosphere. The activity of the developer liquid can be maintained by replenishment and monitored by determining its conductivity as described in EP-A-0107454.

The alkaline material is the primary developing agent for positive-working compositions and its concentration determines the degree of development and the useful life of the developer liquid. The alkaline material may be any alkaline material which, in appropriate amounts, imparts to the developer liquid a pH of at least 12 and preferably 13.5 to 14.0. Examples of suitable alkaline materials are hydroxides such as caustic soda or potassium hydroxide, phosphates such as trisodium phosphate or a metapolyphosphate, amines, such as monoethanolamine, or silicates such as an alkali metal silicate. Suitable silicate concentrations are generally from 4 to 20w/v% preferably from 7 to 12 w/v%. Suitable hydroxide concentrations are 0.2 to 10 w/v% (preferably from 2.0 to 5.0 w/v%), suitable phosphate concentrations are 4 to 20w/v% (preferably 7 to 12w/v%), and suitable amine concentrations are 1 to 20 v/v% (preferably 5 to 10 v/v%).

Surprisingly, it has been found that ethyl hexyl sulphate has a solubility potential which is such as to enable it to carry out the function of the organic solvent which is the essential ingredient in most conventional developers for negative-working compositions. Thus, the ethyl hexyl sulphate is the primary developing agent for negative working compositions. It has the advantage that it has a controlled solvent action on negative working plates such as those based on aqueous developable supported diazo resins whilst being capable of being formulated so as to be non-aggressive towards positive-working plates such as those based on quinone diazide/novolak systems. The ethyl hexyl sulphate is preferably in the form of the sodium salt. However, other salts may be used. Generally its concentration will be from 2 to 50% by vol, preferably from 7.5 to 12.5% by vol, of a 40w/v% solution. Typical concentrations are from 2.5 to 20% by vol of a 40 w/v% solution.

Ordinarily, the ethyl hexyl sulphate would be so aggressive, in the presence of the alkaline material that it would tend to dissolve the less soluble areas of imagewise exposed positive-working compositions and cause overdevelopment. This is prevented by the presence of the surface active agent which forms a thin protective layer on the surface of the image areas of positive-working compositions and so prevents image attack. The presence of the surface active agent does not have an adverse effect on the development of negative-working compositions. The surface active agent is preferably a non-ionic surfactant such as a polyoxyethylene lauryl ether or an ethylene oxide/propylene oxide condensate of poly(ethylene) glycol. The latter is preferred since it also prevents soiling deposits being formed on the plate surface when developing radiation sensitive plates in some automatic plate processors using hard water in their plate washing section. If desired, however, an anionic surfactant such as dibenzene disulphate or the sodium salt of sulphonated dodecyl diphenyl oxide may be used. Generally the surface active agent will be present in an amount of from 0.075% to 1.5% by vol, preferably from 0.2 to 0.5% by vol.

In an embodiment, the developer additionally includes a water soluble salt of an aliphatic carboxylic acid. This may be the potassium or sodium salt of an acid containing 1 to 9 carbon atoms, preferably octanoic acid. It acts as a developing aid for both positive and negative-working compositions. The use of sodium octanoate is preferred. The water soluble salt will generally be present in an amount of from 1% to 20% by vol, preferably from 2% to 6% by vol, of a 40% w/v solution.

In an embodiment, the developer additionally includes a sequestering agent such as the sodium salt of ethylene diamine tetraacetic acid. This has the advantage of complexing calcium and magnesium ions present in the wash water to prevent the formation of hard water salts. It will generally be present in an amount of from 0.2% to 10.0w/v%, preferably 1 to 3w/v%.

The following examples illustrate the invention.

EXAMPLE 1

A series of positive-working pre-sensitised plates consisting of a grained and anodised aluminium substrate coated with a composition based on a quinone diazide and an alkali soluble novolak resin were exposed in a printing down frame beneath a continuous tone step-wedge.

The plates were then processed in a Du Pont-Howson Positive Plate Processor containing in the developer section a developer solution having the formulation:

| | |
|---|---|
| Sodium metasilicate | 3.5 Kg |
| Brij 30 | 0.25 L |
| Rewopol NEHS-40 | 5 L |
| Sodium octanoate solution (40% w/v) | 5 L |
| Nervanaid B Conc. | 1.0 Kg |
| Water to | 50 L |

The developer had a pH of 13.5.

Rewopol NEHS-40 is a 40% solution of the sodium salt of 2-ethyl hexyl sulphate (n - ethyl hexyl sulphate) produced by Rewo Chemicals Ltd, Nervanaid B Conc is the sodium salt of ethylene diamine tetraacetic acid (ABM Chemicals Ltd), and Brij 30 (I.C.I) is a polyoxyethylene lauryl ether surface active agent.

The plate was satisfactorily developed with no sign of overdevelopment.

EXAMPLE 2

A series of negative-working plates were made according to Example 1 of European Patent Specification No. 0030862 and were exposed and processed in the same way as the plate of Example 1. The plates developed cleanly.

EXAMPLE 3

Example 2 was repeated except that plates made according to Example 1 of European Patent Specification No. 0260823 were used. Similar results were obtained.

EXAMPLES 4 TO 6

Examples 1 to 3 were repeated using, as the developer, the following composition:

| | |
|---|---|
| Nervanaid B Conc | 0.25 Kg |
| Sodium metasilicate | 3.50 Kg |
| Sodium octanoate (40%) | 2.50 L |
| Rewopol NEHS 40 | 5.00 L |
| Brij 30 | 0.25 L |
| Water to | 50 L |

The pH of the developer was 13.5. Similar results were obtained in each case.

EXAMPLE 7

Examples 1 to 3 were repeated using as the developer, the following composition:

| | |
|---|---|
| Nervanaid B Conc | 20 Kg |
| Sodium metasilicate (5H$_2$O) | 70 Kg |
| Sodium octanoate (40%) | 100 L |
| Rewopol NEHS 40 | 100 L |
| Supronic B10 | 2 L |
| Demineralised Water to | 1000 L |

Supronic B10 is a surface active agent which is an ethylene oxide/propylene oxide copolymer of poly-(ethylene glycol) and the pH of the developer was 13.5. Similar results were obtained in each case.

EXAMPLE 8

Examples 1 to 3 were repeated using as the developer the following composition:

| | |
|---|---|
| Nervanaid B Conc | 20 Kg |
| Sodium metasilicate (5H$_2$O) | 70 Kg |
| Sodium octanoate (40%) | 100 L |
| Rewopol NEHS 40 | 100 L |
| Supronic B10 | 0.75 L |
| Demineralised Water to | 1000 L |

The pH of the developer was 13.5. Similar results were obtained in each case.

EXAMPLE 9

The following developer formulation was used in an Autopos automatic plate processor to develop an imagewise exposed Super Amazon Plate (Du Pont-Howson) including a positive working radiation sensitive composition based on a quinone diazide and a novolak resin:

| | |
|---|---|
| Sodium Metasilicate | 70 Kg |
| Brij 30 | 5 L |
| Rewopol NEHS4000 | 100 L |
| Sodium octanoate (40% sol) | 100 L |
| Nervanaid B Conc | 20 Kg |
| Demineralised Water to | 1000 L |

The pH of the developer was 13.5.

The plate developed cleanly with no sign of overdevelopment.

Similar results were obtained using a Super Spartan Plate (Du Pont-Howson) and a Triton Plate (Du Pont-Howson) which are similarly based on positive working quinone diazide/novolak compositions.

EXAMPLE 10

The above formulation was used to develop negative-working AQ2 and AQ3 plates (Du Pont-Howson) including radiation sensitive compositions based on a supported diazo resin. The plates developed cleanly with no residual coating in non-image areas.

EXAMPLES 11 TO 15

Examples 9 and 10 were repeated using the following developer formulations:

| | EX11 | EX12 | EX13 | EX14 | EX15 |
|---|---|---|---|---|---|
| Sodium Metasilicate | 70 Kg | 40 Kg | 70 Kg | 70 Kg | 70 Kg |
| Brij 30 | 15 L | 5 L | 5 L | 5 L | 5 L |
| Rewopol NEHS-40 | 100 L | 100 L | 50 L | 100 L | 100 L |
| Sodium Octanoate (40% sol) | 100 L | 100 L | 100 L | 50 L | 100 L |
| Nervanaid B Conc. | 20 Kg | 20 Kg | 20 Kg | 20 Kg | 40 Kg |
| Demineralised Water to | 1000 L | 1000 L | 1000 L | 1000 L | 1000 L |
| pH (Approx) | 13.5 | 13.4 | 13.5 | 13.5 | 13.5 |

In each case, the plates developed cleanly:

EXAMPLES 16 AND 17

Examples 9 and 10 were repeated using the following developer formulations:

| | EX16 | EX17 |
|---|---|---|
| Sodium Metasilicate | 70 Kg | 70 Kg |
| Supronic B10 | 0.75 L | 2 L |
| Rewopol NEHS-40 | 100 L | 100 L |
| Sodium Octanoate (40% sol) | 100 L | 100 L |
| Nervanaid B Conc | 20 Kg | 20 Kg |
| Demineralised water to | 1000 L | 1000 L |
| pH (Approx) | 13.5 | 13.5 |

The plates developed cleanly in each case.

EXAMPLE 18

Example 9 was repeated using commercially available positive working plates viz New Capricorn (Horsell) including a radiation sensitive composition based on a quinone diazide novolak ester, P61 (Hoechst) including a radiation sensitive composition based on a quinone diazide and novolak resin and Nylolith PMS (BASF) including a radiation sensitive composition based on a quinone diazide novolak ester. These plates processed cleanly with no over-development.

EXAMPLE 19

Example 9 was repeated using Nylolith NL (a commercially available negative working plate of BASF including a radiation sensitive composition based on a supported diazo resin system). It developed cleanly.

EXAMPLE 20

The developer formulation of Example 9 was used in an NP60 processor (Horsell) to develop AQ3, Super Amazon and Super Spartan plates and was used in a VA6 processor (Hoechst) to develop AQ3 and Super Amazon plates and an Ultrapos (Horsell) plate including a radiation sensitive composition based on a quinone diazide novolak ester. In all cases it was found to develop both negative and positive plates cleanly.

EXAMPLE 21

A developer liquid was prepared according to the following formulation:

| | |
|---|---|
| Water | 86.74% (by wt) |
| Lithium Benzoate | 7.5% (by wt) |
| 2 Ethyl Hexyl Sulphate | 3.0% (by wt) |
| Potassium Hydroxide | 1.38% (by wt) |
| Citric acid | 1.35% (by wt) |

The pH of the developer was adjusted to pH 7 with potassium hydroxide.

The developer was essentially identical to the developer of Example 8 of U.S. Pat. No. 4,780,396 except that 2-ethyl hexyl sulphate was used instead of sodium octyl sulphate.

In a first experiment, the developer was used in an attempt to develop an image-wise exposed positive-working Super Spartan (Du Pont-Howson Ltd) plate based on quinone diazide/novolak as radiation sensitive composition. No development occurred. In a second experiment, the developer was used in an attempt to develop an image-wise exposed negative working AQ3 (Du Pont-Howson) plate based on a supported diazo resin. Incomplete development occurred.

The pH of the developer was then adjusted with potassium hydroxide in 1 pH unit steps until a pH of 11 was reached. At this pH, development of the negative-working plate was better but still incomplete.

The pH of the developer was then increased again. At pH 13 development of the positive-working plate occurred. Development of the negative-working plate was still not ideal.

EXAMPLE 22

The following mixtures were used to develop various positive- and negative-working plates with the results indicated.

| Plate | Result |
|---|---|
| (a) Developer 1 + Developer 2 (50:50) - pH 13.5 | |
| Super Spartan | No development |
| Marathon AQ2 | Heavy stain |
| Marathon AQ3 | Heavy stain |
| (b) Developer 1 + Developer 3 (50:50) - pH 13.63 | |
| Super Spartan | Slight development Heavy stain |
| Marathon AQ2 | Clean |
| Marathon AQ3 | Slight stain |
| (c) Developer 1 + Water (50:50) - pH 13.56 | |
| Super Spartan | Good development |
| Marathon AQ2 | No development |
| Marathon AQ3 | No development |
| (d) Developer 4 + Developer 5 (50:50) - ph 13.5 | |
| Super Spartan | Overdeveloped so as to render the image unprintable; |
| AQ3 | cleanly developed plate. |

Developer 1 was a standard developer commercially available from Du Pont-Howson for developing Super Spartan (Du Pont-Howson) positive-working plates. It contained sodium metasilicate as essential ingredient and had a pH of @13.8.

Developer 2 was a standard developer commercially available from Du Pont-Howson for developing AQ2 (Du Pont-Howson) negative-working plates. It contained an aqueous solution of mixed anionic and non-ionic surface active agents as essential ingredients and had a pH of @7.5.

Developer 3 was a standard developer commercially available from Du Pont-Howson for developing AQ3 (Du Pont-Howson) negative-working plates. It was similar to Developer 2 but had a lower solids content and a pH of @10.5.

Developer 4 was a standard developer commercially available from Hoechst for developing Hoechst positive working plates based on quinone diazide and novolak resin. It had a pH of @13.5.

Developer 5 was a standard aqueous developer commercially available from Hoechst for developing Hoechst negative working plates based on a supported diazo resin. It had a pH of @9.3.

It can be seen from experiments (a), (b) and (d) that merely mixing conventional developers for positive- and negative-working compositions does not result in the production of a developer which will be suitable for developing both positive- and negative-working plates. Experiment (c) shows that the poor performance of the mixtures on positive-working plates is not due to a dilution effect.

EXAMPLE 23

A developer was prepared as described in Example 1 except that the sodium metasilicate was omitted. It had a pH of 10.6 and although it gave clean development of a negative-working plate based on a supported diazo formulation (AQ3), it would not develop a positive-working Super Spartan plate.

The following additions were made to the developer to increase the pH to the values indicated and the resultant developer liquids were used to develop positive-working plates based on quinone diazide and alkali soluble resin (RD5 and Fuji) and negative-working plates (AQ3). The results indicated below were obtained.

| Additions | pH | Result with Positive Plate | Result with Negative Plate |
|---|---|---|---|
| Monoethanolamine | 12.8 | good development | good development |
| Trisodium phosphate | 13.5 | good development | good development |
| Sodium Hydroxide | 13.9 | good development | good development |

EXAMPLE 24

Example 23 was repeated using developers based on alkali metal hydroxides and octanoates other than sodium hydroxide and sodium octanoate. Similar results were obtained.

EXAMPLE 25

Example 23 was repeated with the sodium octanoate replaced by sodium benzoate, by sodium tartrate, and by sodium succinate. Satisfactory development occurred in each case.

EXAMPLE 26

A developer liquid was prepared according to the following formulation:

| | |
|---|---|
| Nervanaid B Conc | 0.25 Kg |
| Sodium Metasilicate | 1.5 Kg |
| Monoethanolamine | 2.0 L |
| Sodium octanoate | 5.0 L |
| Rewopol NEHS40 | 5.0 L |
| Supronic B10 | 0.1 L |

| -continued | |
|---|---|
| Water to | 50 L |

The pH of the developer liquid was 13.4 and it was used to develop successfully both positive-working and negative-working plates.

We claim:

1. A developer liquid comprising an ethyl hexyl sulphate, a surface active agent which is a polyoxyethylene lauryl ether or an ethylene oxide/propyelene oxide condensate of poly(ethylene)glycol, and alkaline material of a type and in an amount such that the pH of the developer liquid is not less than 12, the surface active agent being present in an amount of from 0.075 to 1.5% by volume and the alkaline material being selected from a silicate in an amount of from 4 to 20 w/v%, a hydroxide in an amount of from 2.0 to 10.0 w/v%, a phosphate in an amount of from 4 to 20 w/v%, or an amine in an amount of from 1 to 20 w/v%.

2. A developer liquid comprising an ethyl hexyl sulphate, dibenzene disulphonate or the sodium salt of sulphonated dodecyl diphenyl oxide, and alkaline material of a type and in an amount such that the pH of the developer liquid is not less than 12.

3. A developer liquid comprising an ethyl hexyl sulphate, an anionic or non-ionic surface active agent, a water soluble salt of an aliphatic carboxylic acid, and alkaline material of a type an in an amount such that the pH of the developer liquid is not less than 12.

4. A developer liquid as claimed in claim 3 wherein the water soluble salt is the sodium or potassium salt of an acid containing 1 to 9 carbon atoms.

5. A developer liquid as claimed in claim 4 wherein the acid is octanoic acid.

6. A developer liquid comprising an ethyl hexyl sulphate, an anionic or non-ionic surface active agent, the sodium salt of ethylene diamine tetra acetic acid, and alkaline material of a type and in an amount such that the pH of the developer liquid is not less than 12.

7. A developer liquid having a pH of not less than 12 and comprising from 4 to 20 w/v% of sodium metasilicate, from 0.075 to 1.5v/v% of an anionic or non-ionic surface active agent, from 2.0 to 50 v/v% of a 40 w/v% solution of sodium ethyl hexyl sulphate, up to 20v/v% of a 40 w/v% solution of sodium octanoate, and up to 10.0 w/v% of the sodium salt of ethylene diamine tetra acetic acid.

* * * * *